United States Patent [19]
Murphy

[11] Patent Number: 6,064,655
[45] Date of Patent: May 16, 2000

[54] METHOD AND APPARATUS FOR TEMPERATURE COMPENSATION IN A TIME DIVISION MULTIPLEX RECEIVER

[75] Inventor: Ian Andrew Murphy, Waldon, United Kingdom

[73] Assignee: Ionica International Limited, Cambridge, United Kingdom

[21] Appl. No.: 08/809,123

[22] PCT Filed: Sep. 8, 1995

[86] PCT No.: PCT/GB95/02129

§ 371 Date: May 28, 1997

§ 102(e) Date: May 28, 1997

[87] PCT Pub. No.: WO96/08888

PCT Pub. Date: Mar. 21, 1996

[30] Foreign Application Priority Data

Sep. 16, 1994 [GB] United Kingdom .................. 9418754

[51] Int. Cl.[7] ............................... H04J 3/14; H04B 1/10
[52] U.S. Cl. .................... 370/252; 370/328; 370/347; 455/501; 455/63; 455/67.1
[58] Field of Search ................... 370/216, 241, 370/252, 337, 458, 524, 328, 347; 455/501, 63, 67.1

[56] References Cited

U.S. PATENT DOCUMENTS

| | | | |
|---|---|---|---|
| 4,630,482 | 12/1986 | Traina | 73/597 |
| 4,747,095 | 5/1988 | Crookshanks | 370/478 |
| 5,170,392 | 12/1992 | Riordan | 370/252 |
| 5,351,016 | 9/1994 | Dent | 375/296 |
| 5,513,183 | 4/1996 | Kay et al. | 370/337 |
| 5,697,073 | 12/1997 | Daniel et al. | 455/126 |

FOREIGN PATENT DOCUMENTS

| | | | |
|---|---|---|---|
| 0 420 508 A2 | 4/1991 | European Pat. Off. | H03J 3/04 |
| 0 523 718 A2 | 1/1993 | European Pat. Off. | H04B 1/04 |
| 4046417 | 2/1992 | Japan | H03L 7/00 |

*Primary Examiner*—Min Jung
*Attorney, Agent, or Firm*—Fish & Richardson P.C.

[57] ABSTRACT

In a receiver for signals set in time slots within fixed length time frames, noise is supplied as an input signal and the received signal value is stored with measured temperature values. Temperature corrections for temperature are determined and stored to be applied subsequently.

31 Claims, 1 Drawing Sheet

METHOD AND APPARATUS FOR TEMPERATURE COMPENSATION IN A TIME DIVISION MULTIPLEX RECEIVER

This is a National Stage Application of PCT Application No. PCT/GB95/02129, filed Sep. 8, 1995.

The invention relates to temperature correction in a telecommunications receiver, in particular in a receiver for signals sent in time slots within fixed length time frames.

The present invention is defined in the claims to which reference should now be made.

According to one aspect, the present invention preferably consists in a method of correcting the output of the receiver in a time division multiplex broadcast unit in accordance with ambient temperature of the receiver, comprising providing an input reference noise signal to the receiver in a predetermined time slot of a time division multiplex channel of the unit and processing the corresponding output noise signal from the receiver to determine a correction factor which is related to a measured value of the current ambient temperature, this factor being used subsequently to correct output signals from the receiver at said ambient temperature.

The invention preferably provides a time division multiplex broadcast unit comprising a receiver, a noise source, temperature measurement means and processing means, the noise source selectively providing a noise signal as an input to the receiver in a predetermined time slot of the time division multiplex channel so that the receiver provides an output signal dependent on the magnitude of the input noise signal and at least one temperature as measured by the temperature measurement means, and the processing means serving to determine an input signal correction factor from the signal and storing this correction factor against the associated temperature.

The receiver can be a transmitter/receiver ("transceiver"). The broadcast unit can be a base station for time division multiplex/time division multiple access (TDM/TDMA) communications with a plurality of subscriber units which can be at fixed locations. The receiver can receive TDMA.

Preferably, correction factors for different associated temperatures are determined, and stored for use in temperature compensation of received signals. The temperature measuring means can measure a first temperature value at a first location of the broadcast unit, and a second temperature at a second location. The first location can be adjacent to an antenna. The antenna can be exposed, for example, at the top of a mast head. The second location can be adjacent processing circuitry, particularly in the body of the broadcast unit.

Each correction factor can be determined dependent on a plurality of temperatures and stored together with data representing those temperatures, for example, as a look-up table in microprocessor memory. In particular, a correction value can be associated with a temperature measured at the first position and a temperature measured at the second position.

The stored correction factors can be updated intermittently or continuously, according to a predetermined rule. In particular, correction update or re-calibration can occur after a predetermined period of time has elapsed or whenever a novel combination of temperatures is encountered. Re-calibration can also be initiated under microprocessor control, whenever a fault condition is suspected.

In essence, the look-up table of correction factors can be filled in "as you go". No separate initial calibration procedure is required.

With repeated calibration, changes in correction factors and/or temperatures can be monitored, allowing detection of fault conditions. Furthermore, changes in the apparent noise received at a site can be monitored.

Figure 1:
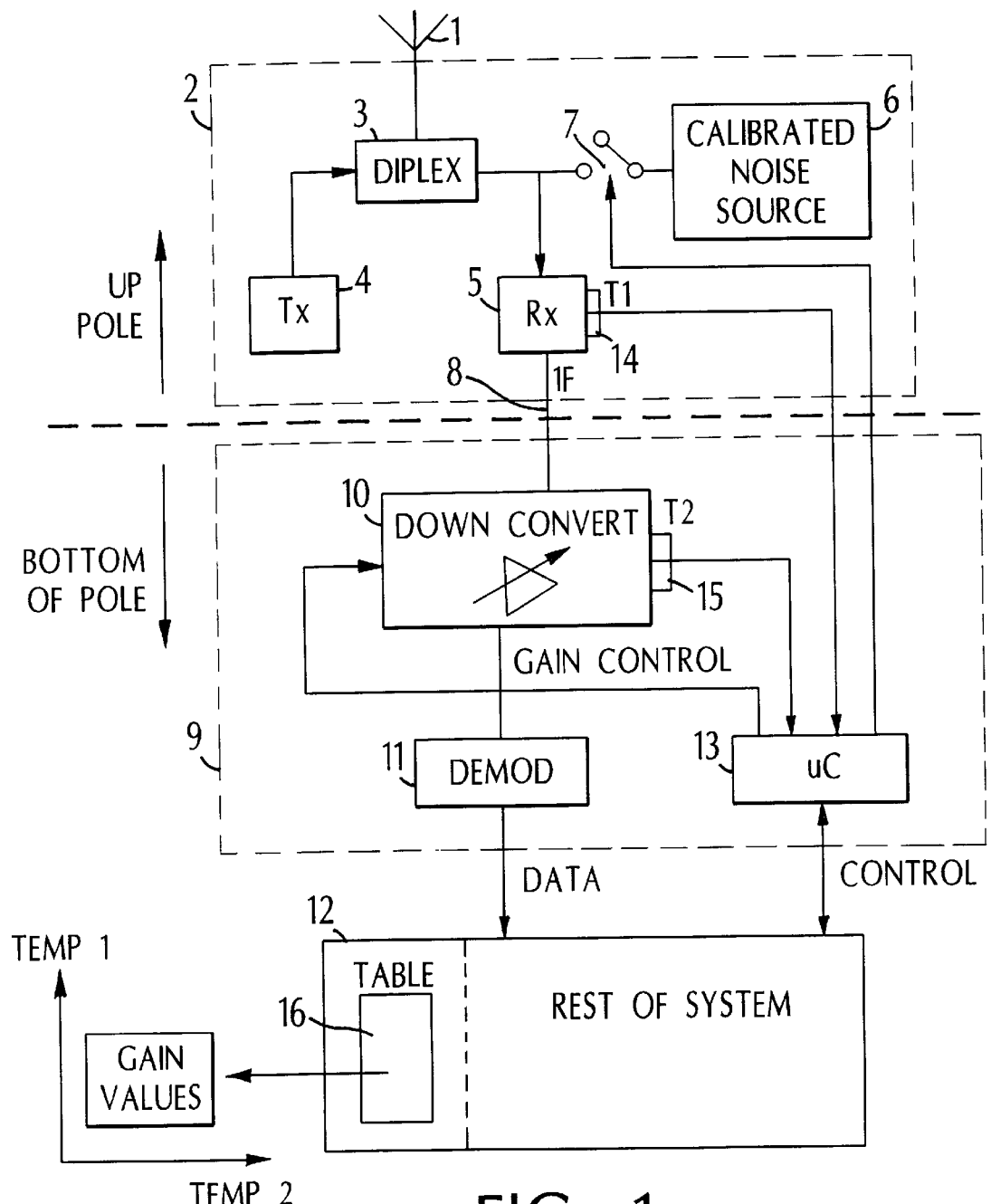
FIG. 1 shows the telecommunications receiver in accordance with the present invention.

A preferred embodiment of the invention will now be described by way of example and with reference to the drawing illustrating a preferred base station according to the present invention.

The drawing shows a base station comprising a mast which supports an aerial 1 at the top and a radio unit 2 near the aerial with an input-output connection to the aerial. This connection comprises a diplexer unit 3 through which a transmitter 4 and a receiver 5 are connected to the aerial. The radio unit 2 also incorporates a reference noise source 6 which can be selectively connected to the input of the receiver 5 under the control of switch means 7 for determining temperature correction data, as described hereinafter.

The radio signal received by the receiver 5 is amplified and converted to an IF signal, and supplied via a cable 8 to a converter and demodulator unit 9 at the base of the mast.

A downconvert stage 10 receives the IF signal, and after conversion, passes the signal to a demodulator stage 11 which produces an output data signal to other equipment 12 of the communications system at the base station.

The downconvert stage 10 has a variable gain which is controlled by a controller 13 in accordance with the temperature T1 of the receiver 5, as determined by an electronic thermometer 14, and the temperature T2 of the downconvert stage, as determined by an electronic thermometer 15. A look-up table stored in a memory 16 holds appropriate gain values for predetermined combinations of temperature ranges, and these are retrieved by the T1, T2 controller 13 in accordance with the values of the two temperatures measured.

The gain values stored in the memory 16 are determined from a calibration procedure which is carried out while the communication system is in operation receiving radio signals, and which involves the use of the reference noise source 6 to provide a reference input to the receiver 5 in a predetermined channel of the TDM input. The switch means 7 is closed to initiate calibration, and this causes the noise signal to be sent to the receiver 5 in a predetermined TDM time slot in each TDM frame. The corresponding output of the receiver 5 is monitored, and by comparison with the known reference noise signal, the system is able to determine a correction factor or gain value for the particular temperatures, T1, T2 that prevail at that time.

The controller 13 may operate to receive the output signal from the receiver as well as data of temperatures T1 and T2. The controller calculates correction factor/gain values and updates the values stored in memory 16 for the various combinations of temperature bands. The values are kept in, for example, a 10×10 matrix of temperature bands, which correspond to temperatures T1 and T2. In other embodiments, different sized matrixes can be used.

The controller 13 may be the central management entity of the base station.

The noise source 6 preferably generates a noise signal at a fixed level above the system reference level. This reference level is the minimum level at which reception with a satisfactory Bit Error Rate will occur. In the preferred embodiment the system reference level is −101 dBm and the Bit Error Rate is no more than one in $10^3$.

The noise signal is preferably applied to the transceiver during one selected TDM time slot in a multi-slot TDM frame preferably having 10 slots. This slot is one which is not currently being used for data transfer. TDM frames are sent in TDM channels. In practice, the circuitry associated with three channels are in proximity at a base station. Applying noise on one channel only might cause cross-channel interference to the other channels. To overcome this, the noise signal is provided simultaneously on all three channels in simultaneous time slots, none of which carry data. The temperature corrections are then determined for all three channels.

Calibrations or re-calibrations may be triggered by a predetermined time lapse, for example, half-an-hour, or whenever the temperatures T1 and T2 are in a combination of ranges which has not been previously determined, or whenever a fault condition is suspected.

Repeated re-calibration ensures that variations in receiver sensitivity are compensated for accurately over time. Furthermore, trends in corrections and temperature values can be followed, giving rise to early detection of fault conditions. Repeated calibrations also provide an early warning should the apparent level of noise at a base site change significantly. This effect could be due to a faulty antenna or other equipment, or could be due to a genuine increase in noise at the site. Both conditions would require investigation so are usefully monitored. The calibration data in the matrix may be read by a remote processor for monitoring performance of the system and providing early warning of problems.

What is claimed is:

1. Apparatus for receiving radio signals in time slots within fixed length time frames comprising calibration means operative for repeated calibration of a receiver during operation of the receiver, the calibration means comprising a noise source, temperature measurement means and processing means, the noise source selectively providing, in a predetermined time slot within a fixed length time frame, a noise signal of predetermined magnitude to the receiver, the receiver detecting the noise signal and providing an output signal which is a processed form of the noise signal and which is dependent on the magnitude of the noise signal and at least one temperature as measured by the temperature measurement means, and the processing means serving to determine a signal correction factor from the output signal provided by the receiver in response to the noise signal and storing this correction factor against the associated temperature for subsequent use in correcting output signals provided by the receiver in response to received radio signals.

2. Apparatus for receiving radio signals according to claim 1, in which the predetermined time slot in which the noise signal is applied is not one being used for transmitting signals.

3. Apparatus for receiving radio signals according to claim 1, in which the processing means determines correction factors from the output signal from the receiver for different associated temperatures measured by the temperature measurement means, and the processing means stores the correction factors for use in temperature compensation of received signals.

4. Apparatus for receiving radio signals according to claim 3, in which the receiver comprises an antenna for reception of the signals which are sent by radio, and the temperature measuring means measures a first temperature at a first location, and a second temperature at a second location, the first location being adjacent to the antenna.

5. Apparatus for receiving radio signals according to claim 4, in which the antenna is exposed on a mast head.

6. Apparatus for receiving radio signals according to claim 4, in which the second location is adjacent to processing circuitry.

7. Apparatus for receiving radio signals according to claim 6, in which the second location is in the body of the broadcast unit.

8. Apparatus for receiving radio signals according to claims 3, in which each correction factor is determined dependent on a plurality of temperatures and stored together with data representing those temperatures.

9. Apparatus for receiving radio signals according to claim 8, in which correction factors and temperature data are stored as a look-up table in microprocessor memory.

10. Apparatus for receiving radio signals according to claim 8, in which correction factors are stored associated with a first temperature measured at the first location and a second temperature measured at the second location.

11. Apparatus for receiving radio signals according to claim 1, in which correction factors are determined intermittently or continuously according to a predetermined rule.

12. Apparatus for receiving radio signals according to claim 11, in which a correction factor is determined whenever a predetermined period of time has elapsed.

13. Apparatus for receiving radio signals according to claim 11, in which a correction factor is determined whenever a novel combination of temperatures is encountered.

14. Apparatus for receiving radio signals according to claims 11, in which determination of correction factors is effected under microprocessor control whenever a fault condition is suspected.

15. Apparatus for receiving radio signals according to claim 11, in which changes in correction factors and/or temperatures are monitored so as to detect a fault condition.

16. Apparatus for receiving radio signals according to claim 11, in which change in the apparent noise received is monitored so as to detect a fault condition.

17. Apparatus for receiving radio signals according to claim 1, in which the receiver is a transceiver.

18. Apparatus for receiving radio signals according to claim 1, in which the apparatus is a base station for TDM/TDMA communications with a plurality of subscriber units, and comprises three receivers, the noise signal being provided to the receivers simultaneously to avoid cross-channel interference and determine correction factors therefore.

19. A method of correcting the output signals provided by a receiver in response to radio signals it receives in time slots within fixed length time frames in accordance with ambient temperature of the receiver, said method including repeated calibration cycles during operation of the receiver, each calibration cycle comprising providing an input reference noise signal to the receiver in a predetermined time slot within fixed length time frames to cause the receiver to produce a corresponding output signal which is a processed form of the reference noise signal and processing the corresponding output signal dependent on its detected magnitude to determine a correction factor which is related to at least one measured value of the current ambient temperature, this factor being used subsequently to correct output signals from the receiver in response to radio signals received at said ambient temperature.

20. A method of correcting the output signals provided by a receiver according to claim 19, in which the predetermined time slot in which the noise signal is applied is not one being used for transmitting signals.

21. A method of correcting the output provided by a receiver according to claim 19, in which correction factors for different associated temperatures are determined, and stored for use in temperature compensation of received signals.

22. A method of correcting the output provided by a receiver according to claim 21, in which the receiver comprises an antenna, and in which method a first temperature is measured at a first location; and a second temperature is measured at a second location, the first location being adjacent to the antenna.

23. A method of correcting the output provided by a receiver according to claim 22, in which the receiver comprises processing circuitry and in which method the second location is adjacent to said processing circuitry.

24. A method of correcting the output provided by a receiver according to claim 21, in which each correction factor is determined dependent on a plurality of temperatures and stored together with data representing those temperatures.

25. A method of correcting the output provided by a receiver according to claim 24, in which correction factors and temperature data are stored as a look-up table in microprocessor memory.

26. A method of correcting the output provided by a receiver according to claim 19, in which correction factors are determined intermittently or continuously according to a predetermined rule.

27. A method of correcting the output provided by a receiver according to claim 26, in which a correction factor is determined whenever a predetermined period of time has elapsed.

28. A method of correcting the output provided by a receiver according to claim 26, in which a correction factor is determined whenever a novel combination of temperatures is encountered.

29. A method of correcting the output provided by a receiver according to claim 26, in which determination of correction factors is effected under microprocessor control whenever a fault condition is suspected.

30. A method of correcting the output provided by a receiver according to claim 26, in which changes in correction factors and/or temperatures are monitored so as to detect a fault condition.

31. A method of correcting the output provided by a receiver according to claim 25, in which changes in apparent noise received is monitored so as to detect a fault condition.

* * * * *